(12) United States Patent
Wang et al.

(10) Patent No.: US 7,332,061 B2
(45) Date of Patent: Feb. 19, 2008

(54) INTEGRATION OF MULTIPLE FREQUENCY BAND FBAR FILTERS

(75) Inventors: Li-Peng Wang, San Jose, CA (US); Qing Ma, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 778 days.

(21) Appl. No.: 10/816,560

(22) Filed: Mar. 30, 2004

(65) Prior Publication Data

US 2005/0221022 A1     Oct. 6, 2005

(51) Int. Cl.
*C23C 14/35*     (2006.01)
(52) U.S. Cl. .................. 204/192.18; 204/192.12; 204/192.15; 204/298.06
(58) Field of Classification Search .......... 204/192.12, 204/192.15, 192.18, 298.06, 298.15; 118/728
See application file for complete search history.

(56) References Cited

U.S. PATENT DOCUMENTS

| 5,091,208 | A | * | 2/1992 | Pryor ....................... 427/573 |
| 5,178,739 | A | * | 1/1993 | Barnes et al. .......... 204/192.12 |
| 6,262,637 | B1 | | 7/2001 | Bradley et al. |
| 6,377,137 | B1 | | 4/2002 | Ruby |
| 6,483,229 | B2 | | 11/2002 | Larson, III et al. |
| 6,486,751 | B1 | | 11/2002 | Barber et al. |
| 6,566,979 | B2 | | 5/2003 | Larson, III et al. |

* cited by examiner

*Primary Examiner*—Rodney G. McDonald
(74) *Attorney, Agent, or Firm*—Schwabe, Williamson & Wyatt, P.C.

(57) ABSTRACT

A method and system for forming FBAR filters for different frequency bands with film stacks of different thicknesses, where at least some layers of different thicknesses are formed substantially at the same time, during a process operation are described herein.

17 Claims, 4 Drawing Sheets

INTEGRATION OF MULTIPLE FREQUENCY BAND FBAR FILTERS

TECHNICAL FIELD & BACKGROUND

The present invention is related to the field of Microelectromechanical Systems (MEMS). More specifically, the present invention is related to integration of film bulk acoustic resonators (FBAR) filters for different frequency bands.

Radio frequency (RF) front-end passives, such as transceivers and receivers are increasingly needed for wireless communication. These front-end passives include front-end filters. RF front-end filters consisting of FBAR have been found to have a number of advantages over other technologies, such as surface acoustic wave (SAW) devices and ceramic filters, particularly at relatively high frequencies.

The thickness of the film stack of a FBAR filter is generally governed by the half wavelength of the frequency band of the FBAR filter. For example, the thickness of the film stack of a FBAR filter for the 1900 MHz frequency band is about 1.8 µm, whereas the thickness of the film stack of a FBAR filter for the 950 MHz frequency band is about 3.6 µm.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF ILLUSTRATIVE EMBODIMENTS

Embodiments of the present invention include, but are not limited to, a component having multiple different frequency band FBAR filters with film stacks of different thickness, where at least some film stack layers of different filters are formed via the same process operation(s), a method for making such component, and a system having such component.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention, however, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising", "having" and "including" are synonymous, unless the context dictates otherwise.

Figure 1:
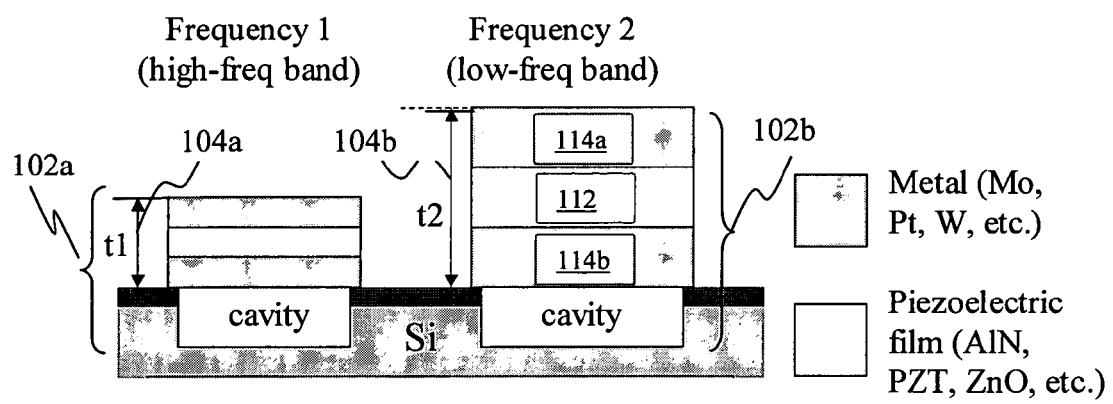
FIG. 1 illustrates a simplified cross section view of a component having FBAR filters with film stacks of different thickness for different frequency bands.

Referring now to FIG. 1, wherein a simplified cross section view of a component having FBAR filters of different frequency bands, in accordance with one embodiment, is shown. As illustrated, component 100 includes multiple FBAR filters 102a-102b for different frequency bands. Accordingly, FBAR filters 102a-102b have film stacks 104a-104b of corresponding different thicknesses (t1 and t2).

In various embodiments, each film stack 104a/104b includes a piezoelectric layer 112, sandwiched between two metal layers 114a-114b. The thickness of each of the layers 114a, 112 and 114b is proportional to the overall corresponding thickness (t1 and t2).

In various embodiments, the piezoelectric layer 112 may be formed with materials such as Aluminum Nitride (AlN), Lead Zirconate Titanate (PZT), Zinc Oxide (ZnO) and so forth, while each of the metal layers 114 may be formed with materials such as Molybium (Mo), Platinum (Pt), Tungsten (W) and so forth.

As will be described in more detail below, notwithstanding the film stack layers' differences in thickness, the corresponding film stack layers may be formed via corresponding process operations, one corresponding process operation for each set of corresponding film stack layers. That is, unlike the prior art, the film stacks of different thicknesses do not have to be formed via multiple sequential deposition and etching operations, one set of deposition and etching operations for one layer of one filter. In various embodiments, the same process operation or operations are ionized physical vapor deposition (IPVD) operation or operations.

While for ease of understanding, component 100 has been illustrated with only two FBAR filters 102a-102b of different frequency bands, the invention is not so limiting. As will be readily apparent from the descriptions to follow, the present invention may also be practiced to simultaneously form more than two FBAR filters of different frequency bands with film stacks of different corresponding thicknesses, where their corresponding layers are formed via corresponding process operations (one corresponding process operation for each set of corresponding film stack layers).

Further, while for ease of understanding, the present invention is being described with embodiments where the corresponding layers of the film stacks of different FBAR filters are formed via corresponding same process operations, in alternate embodiments, the present invention may also be practiced with non-corresponding like kind layers of the film stacks of different FBAR filters being formed via the same process operation(s).

For example, for the earlier described embodiment where each film stack 104a/104b includes a piezoelectric layer 112, sandwiched between two metal layers 114a-114b, the bottom metal layer 114b of one film stack e.g. 104a may be formed with the top metal layer 114a of another film stack, e.g. 104b, via the same process operation.

Figure 2:
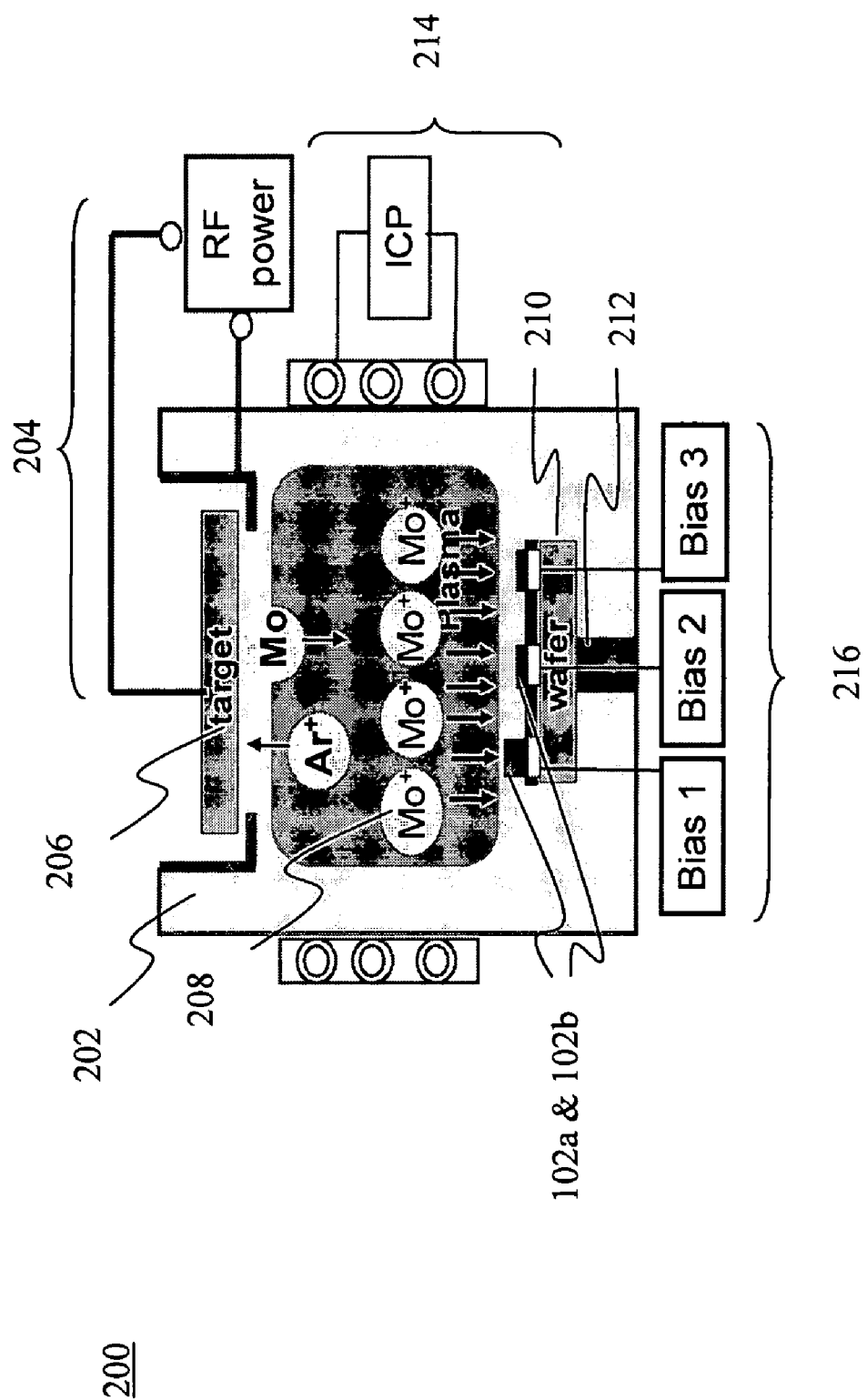
FIG. 2 illustrates a simplified cross section view of an ionized physical vapor deposition apparatus suitable for use to form the layers of the different frequency band/thickness FBAR filters of FIG. 1 via the same process operations, in accordance with one embodiment.

Referring now to FIG. 2, wherein a simplified cross section view of an ionized physical vapor deposition (IPVD) apparatus suitable for use to make the FBAR filters of different frequency bands of FIG. 1, via the same process operation or operations, in accordance with one embodiment, is shown. As illustrated, IPVD apparatus 200 includes chamber 202 and complementary facilities 204 to bombard target 206 with an accelerated ionized gas to create sputter materials 208, which may be Mo+ (as shown), for deposition on a substrate of a wafer 210 held on holder 212 within chamber 200. In various embodiments, the target material is "neutral". In alternate embodiments, the sputtered materials may be Al+ or other sputtered materials of like kind.

Further, for the embodiment, IPVD apparatus 200 also includes facilities 214 to allow an inductively coupled plasma (ICP) to be added to sputtered materials 208. In alternate embodiments, IPVD apparatus 200 may be a sputter system plus Microwave Electron Cyclotron Resonance (ECR) Plasma, a sputter system plus Hollow Cathode Magnetron sputtering, or other enhanced sputter system of the like.

Finally, IPVD apparatus 200 includes voltage circuits 216 to allow different bias voltages to be applied to different desired regions of the substrate of wafer 210. Resultantly, by controlling the different bias voltages applied to the different locations, film stack layers of different thicknesses may be effectuated at the desired locations via the same process operation or operations.

In various embodiments, the bias voltages are direct current (DC) voltages, while in other embodiments, the bias voltages may be radio frequency (RF) voltages.

Except for the employment of multiple voltage circuits 216 to apply different bias voltage to different regions of a substrate of a wafer at the same time, IPVD apparatus 200 may otherwise be any one of a number of IPVD apparatuses. Similarly, voltage circuits 216 may be implemented in any one of a number of manners.

Figure 3:
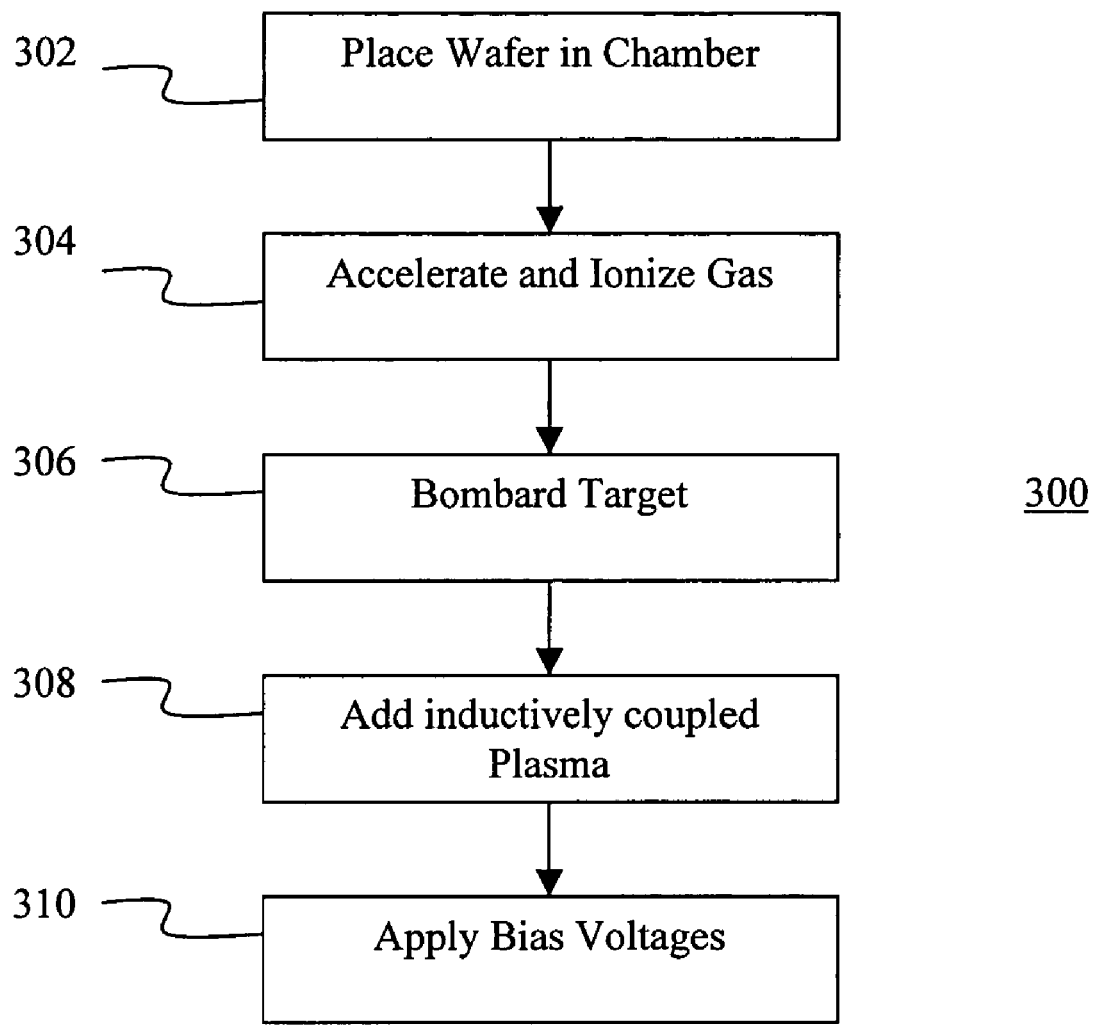
FIG. 3 illustrates a flow chart depicting the method of the present invention for making different film stack layers of different FBAR filters of different frequency bands via the same process operation, in accordance with one embodiment.

Referring now to FIG. 3, where a method of the present invention for making different film stack layers of different FBAR filter in a same process operation, in accordance with one embodiment, is shown. As illustrated, for the embodiment, process 300 starts with placing a wafer inside the earlier described chamber of FIG. 2, block 302.

Next, gas is first ionized and accelerated, block 304. Then, the ionized and accelerated gas is employed to bombard a neutral target, block 306, to create sputtered materials within the chamber.

Further, inductively coupled plasma are added to the sputtered materials, block 308. Upon the addition, different bias voltages are applied to different desired locations of the substrate, block 310.

The levels of the bias voltages correspond to the thickness of the film stack layers desired at the desired locations. As a result, film stack layers of different desired thicknesses may be formed for different FBAR filters at different locations of the wafer, by the same process operation.

Process 300 may be repeated for other different film stack layers, resulting eventually in the desired FBAR filters of the different frequency bands.

Figure 4:
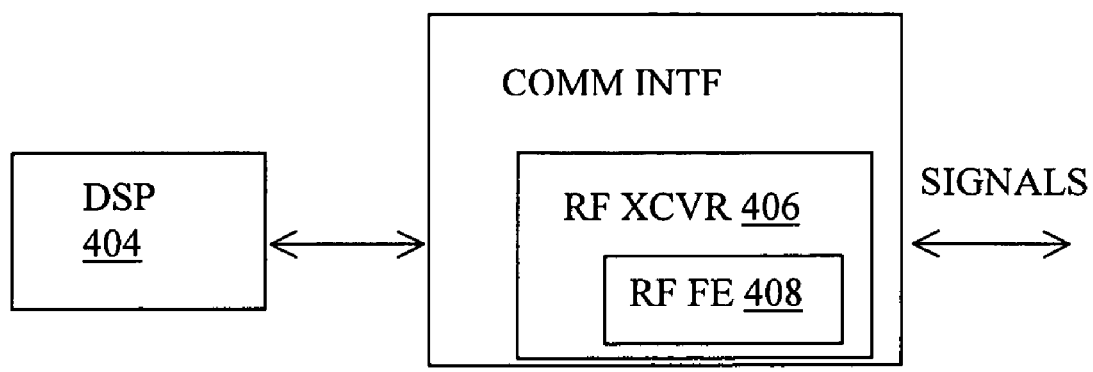
FIG. 4 illustrates a system having a component of FIG. 1 formed using e.g. the IPVD apparatus of FIG. 2 and the process of FIG. 3, in accordance with one embodiment.

FIG. 4 illustrates a system in accordance with one embodiment. As illustrated, for the embodiment, system 400 includes a communication interface 402 for receiving and sending RF signals. Communication interface 402 includes a number of components, in particular, a RF transceiver 406 having front end 408. More specifically, for the embodiment, front end 408 is component 100 endowed with FBAR filters for different frequency bands, having film stacks of corresponding different thicknesses, in which at least some of the film stack layers of the different FBAR filters are formed via the same process operation(s) as earlier described.

Further, system 400 includes digital signal processor 404 coupled to communication interface 402 for processing the signals received, and providing communication interface 402 with the signals to be transmitted.

Depending on the applications, system 400 may include other components, including but are not limited to volatile and non-volatile memory, mass storage (such as hard disk, compact disk (CD), digital versatile disk (DVD) and so forth), and so forth.

In various embodiments, system 400 may be a personal digital assistant (PDA), a wireless mobile phone, a tablet computing device, a laptop computing device, a desktop computing device, a set-top box, an entertainment control unit, a digital camera, a digital video recorder, a CD player, a DVD player, or other digital device of the like.

Thus, it can be seen from the above descriptions, a novel component having FBAR filters for different frequency bands with film stacks of corresponding different thickness, where at least some the film stack layers of the different FBAR filters are formed via the same process operation(s), method for so making such a component, and a system having such a component have been described. While the present invention has been described in terms of the foregoing embodiments, those skilled in the art will recognize that the invention is not limited to the embodiments described. The present invention can be practiced with modification and alteration within the spirit and scope of the appended claims.

Thus, the description is to be regarded as illustrative instead of restrictive on the present invention.

What is claimed is:

1. A method comprising:
ionizing a sputtered material; and
applying a first and a second bias voltage to a first and a second region of a substrate of a micro-electromechanical system (MEMS) to form a first and a second layer of a first and a second film stack of a first and a second film bulk acoustic resonators filter of the MEMS for a first and a second frequency band respectively, the first and second layers having first and second desired thicknesses, and the first and second bias voltages being applied in accordance with at least the first and second desired thicknesses, respectively.

2. The method of claim 1, wherein said ionizing comprises ionizing atoms of the sputtered material.

3. The method of claim 1, wherein said ionizing comprises ionizing a sputtered material selected from the sputtered material group consisting of Mo and Al.

4. The method of claim 1, wherein said ionizing comprises ionizing a sputtered material in an ionized vapor deposition chamber.

5. The method of claim 1, wherein said ionizing of a sputtered material is performed as part of an ionized physical vapor deposition operation.

6. The method of claim 1, wherein said ionizing of a sputtered material is performed as part of a deposition operation.

7. The method of claim 1, wherein said applying comprises applying the first and second bias voltages selected from the voltage group consisting of direct current voltages and radio frequency voltages.

8. The method of claim 1, wherein the first and second desired thicknesses are equal, and said applying comprises applying the first and second bias voltages at a corresponding equal level.

9. The method of claim 1, wherein the first and second desired thicknesses are unequal, and said applying comprises applying the first and second bias voltages at corresponding first and second unequal levels.

10. The method of claim 1, wherein
the applying of the first and second bias voltages are performed at a first point in time; and
the method further comprises applying a third and a fourth bias voltage to the first and second regions of the substrate at a second point in time, subsequent to the first point in time, to form a third and a fourth layer of the first and second film stacks, respectively, the third and fourth layers having third and fourth desired thicknesses, and disposed on top of the first and second layers respectively, and the third and fourth bias voltages being dependently applied in accordance with at least the third and fourth desired thicknesses respectively.

11. The method of claim 10, wherein the method further comprises forming a fifth layer of the first film stack, at a third point in time, subsequent to the first and second points in time, the fifth layer having a fifth desired thicknesses and disposed on top of said third layer.

12. The method of claim 1, wherein the method further comprises forming a third layer of the first film stack, at a second point in time, subsequent to the first point in time, the third layer having a third desired thicknesses and disposed on top of said first layer.

13. A method comprising:
forming a first and a second layer of a first and a second film stack of a first and a second film bulk acoustic resonators filter for a first and a second frequency band, respectively, at a first point in time, for a microelectromechanical system (MEMS), the first and second layers having a first and a second thicknesses respectively;

ionizing a sputtered material; and applying a first and a second bias voltage to a first and a second region of a substrate of the MEMS to form a third and a fourth layer of the first and second film stacks, on top of the first and second layers, respectively, at a second point in time, subsequent to said first point in time, the third and fourth layers having third and fourth desired thicknesses, and the first and second bias voltages being applied in accordance with at least the first and second desired thicknesses.

14. The method of claim 13, wherein said ionizing comprises ionizing a sputtered material selected from the sputtered material group consisting of Mo and Al.

15. The method of claim 13, wherein said ionizing comprises ionizing a sputtered material in an ionized vapor deposition chamber.

16. The method of claim 13, wherein said ionizing of a sputtered material is performed as part of an ionized physical vapor deposition operation.

17. The method of claim 13, wherein said ionizing of a sputtered material is performed as part of a deposition operation.

* * * * *